United States Patent
Drowley (10) Patent No.: US 6,906,302 B2
(45) Date of Patent: Jun. 14, 2005

(54) PHOTODETECTOR CIRCUIT DEVICE AND METHOD THEREOF

(75) Inventor: Clifford I. Drowley, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 125 days.

(21) Appl. No.: 10/208,212

(22) Filed: Jul. 30, 2002

(65) Prior Publication Data

US 2004/0021057 A1 Feb. 5, 2004

(51) Int. Cl.[7] .............................................. H01L 27/00
(52) U.S. Cl. .............................. 250/208.1; 250/214 A
(58) Field of Search ........................ 250/208.1, 559.26, 250/214 A; 356/5.01, 4.01; 348/308, 241; 257/290, 291, 292

(56) References Cited

U.S. PATENT DOCUMENTS

| | | | |
|---|---|---|---|
| 4,734,587 A | 3/1988 | Schwarte | |
| 4,737,624 A | 4/1988 | Schwarte | |
| 4,849,644 A | 7/1989 | Mira et al. | |
| 5,523,835 A | 6/1996 | Tanaka | |
| 5,600,696 A | 2/1997 | Sauer | |
| 5,841,126 A | 11/1998 | Fossum et al. | |
| 6,040,570 A | 3/2000 | Levine et al. | |
| 6,088,085 A | 7/2000 | Wetteborn | |
| 6,137,566 A | 10/2000 | Leonard | |
| 6,317,154 B2 * | 11/2001 | Beiley | .......................... 348/308 |
| 6,323,942 B1 | 11/2001 | Bamji | |
| 6,532,040 B1 | 3/2003 | Kozlowski et al. | |
| 6,730,898 B2 * | 5/2004 | Machida | ................... 250/208.1 |
| 2001/0024271 A1 | 9/2001 | Takayanagi et al. | |

FOREIGN PATENT DOCUMENTS

| | | |
|---|---|---|
| WO | WO 98/10255 | 3/1998 |
| WO | WO 99/60629 | 11/1999 |
| WO | WO 00/52765 | 9/2000 |

OTHER PUBLICATIONS

Steven Decker et al, "A 256×256 CMOS Imaging Array with Wide Dynamic Range Pixels and Column–Parallel Digital Output," 1998 IEEE Journal of Solid–State Circuits, vol. 33, No. 12, pp. 2081–2091.

* cited by examiner

Primary Examiner—Thanh X. Luu
Assistant Examiner—Seung C. Sohn
(74) Attorney, Agent, or Firm—Toler, Larson & Abel, LLP (57) ABSTRACT

A distance measuring device and photosensor circuit are disclosed herein. By pulsing a light source such as an LED to illuminate an object and measuring the phase difference between the light reflected from the object and the original phase of the light source, the distance to an object may be determined. In order to measure the phase difference, a CMOS photosensor or photosensor array may be used to receive the reflected light and store charge generated during different portions of time in different storage nodes or pixel cells. The difference between the amount of charge stored in different storage nodes can be used to determine the phase difference between the original light illuminating the object and the light reflected from the object. This phase difference can in turn be used to determine the distance to the object.

27 Claims, 4 Drawing Sheets

FIG. 7

PHOTODETECTOR CIRCUIT DEVICE AND METHOD THEREOF

CO-PENDING APPLICATIONS

This application is related to U.S. application Ser. No. 10/208,217, entitled "SYSTEM, CIRCUIT AND METHOD PROVIDING A DYNAMIC RANGE PIXEL CELL WITH BLOOMING PROTECTION", filed on even date here with.

FIELD OF THE DISCLOSURE

This disclosure relates generally to photosensitive circuits, and more particularly to photosensitive pixel cells.

BACKGROUND

One method of determining the distance to an object is to illuminate the object with pulsed light and compare the phase of the reflected light pulses with the phase of the light pulses used to illuminate the object. Typically, distance measuring devices employing this and similar methods employ charge-coupled devices (CCD's) to sense the reflected light, and complimentary metal oxide semiconductor (CMOS) circuitry to implement associated circuitry such as controllers, analog-to-digital (A/D) converters, and the like.

In operation, the CCD's receive the reflected light and generate an amount of charge related to the amount of light received. This charge is stored over particular periods of time, sometimes referred to as integration periods. Between integration periods, the CCD's dump stored charge to a storage node. The amount of charge stored in a node corresponds to the amount of charge generated by a CCD during a particular integration period, and can be compared to the amount of charge corresponding to a different integration period to determine a phase difference between the light used to illuminate the object and light reflected from the object back to the CCD sensor. In some cases, different CCD's are used to generate charge during different integration periods instead of using a single CCD to generate charge for all integration periods.

CCD's, however, use a relatively large amount of power, are more complicated to fabricate, and require more complex power supplies than, for example, CMOS circuitry. In addition, CCD's are incompatible with CMOS circuitry, and CMOS circuitry is often used in manufacturing semiconductor devices. Because of this incompatibility, when CCD's are used in distance determining devices, complex interface circuits, companion chips, etc. must be built so that the CMOS circuitry and the CCD circuitry can be used together. What is needed, therefore, is a sensor capable of easier integration with low cost CMOS technologies, without requiring the higher power consuming circuits of CCD technologies, and avoiding costly fabrication of complex interface circuitry.

BRIEF DESCRIPTION OF THE DRAWINGS

Various advantages, features and characteristics of the present disclosure, as well as methods, operation and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

FIGS. 1–7 illustrate a circuit and device including a pixel sensor, and showing how such a device can be used to measure distances. By pulsing a light source so that an object is illuminated with light and by receiving light reflected from that object using one or more photosensors constructed using CMOS or CMOS compatible processes, the distance to that object can be determined. By employing photosensors or photosensor arrays constructed using CMOS technologies, such a distance measuring device can be constructed efficiently and at lower cost than devices employing other technologies, such as CCD technologies.

Figure 1:
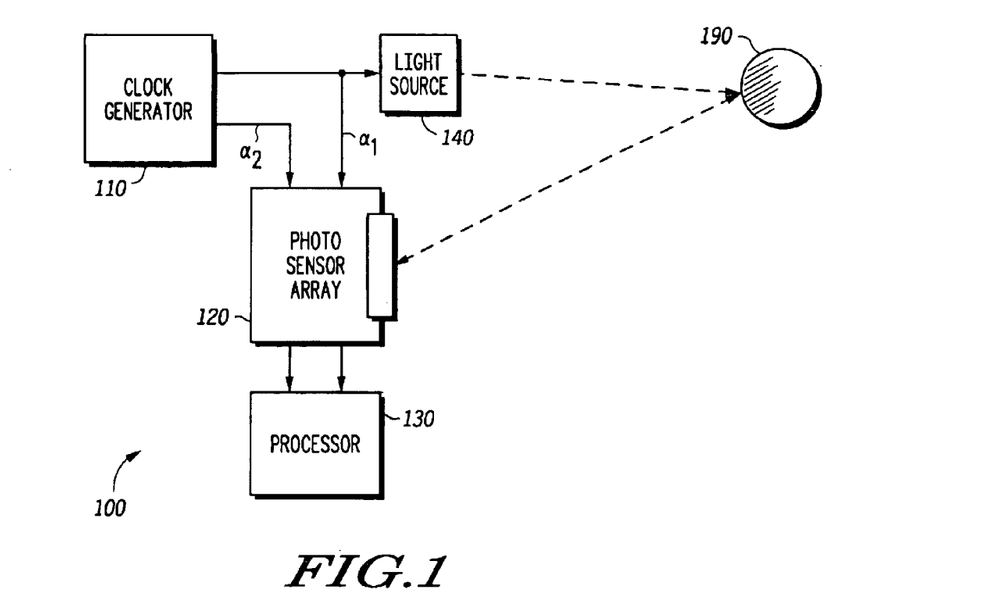
FIG. 1 is a diagram illustrating a distance measuring device operating according to an embodiment of the present disclosure.

Referring first to FIG. 1, a distance-measuring device according to an embodiment of the present disclosure will be discussed, and is designated generally as Distance Measuring Device (DMD) 100. DMD 100 in one embodiment includes clock generator 110 to supply a modulated clock signal to a light source such as light emitting diode (LED) 140, as well as in-phase clock signal $\alpha_1$ and out-of-phase clock signal $\alpha_2$ to photosensor array 120. Photosensor array 120 receives reflected light from object 190, and uses the clocks $\alpha_1$ and $\alpha_2$ to define periods over which charge generated in response to the reflected light received from object 190 is stored in and read out of various storage nodes (not illustrated). The charge from these various storage nodes is read out of photosensor array 120 by processor 130, which uses the value of the stored charge to determine a phase difference between light emitted from LED 140 and reflected light received at photosensor array 120. This phase difference can then be used to determine the distance of object 190 from DMD 100.

Clock generator 110, in one embodiment, modulates a reference clock signal and drives the modulated signal to LED 140 to control, or pulse, LED 140 such that the light emitted by LED 140 is pulsed at a particular frequency and phase. Note that LED 140 is pulsed in synchronization with the in-phase clock signal $\alpha_1$, which is used as a reference clock signal. Clock generator 110 also provides in-phase clock signal $\alpha_1$ to photosensor array 120 for use in controlling the operation of various transistors associated with photosensor array 120. In addition to in-phase clock signal $\alpha_1$, clock generator 110 also supplies out-of-phase clock signal $\alpha_2$, which is out of phase with the in-phase clock signal $\alpha_1$. Out-of-phase clock signal $\alpha_2$ is used in conjunction with in-phase clock signal $\alpha_1$ to control the timing of other transistors within photosensor array 120. The specific interactions of the clock signals generated by clock generator 110 with the transistors within photosensor array 120 will be discussed in greater detail subsequently. However, in general both the in-phase and out-of-phase signals provided to photosensor array 120 are used to control when charge generated by photosensor array 120 in response to light reflected from object 190 is stored, in which node such charge will be stored, and when the charge from the storage nodes will be read out to processor 130.

Photosensor array 120 may contain one or more photosensors and two or more pixel cells. Each of photosensor includes a photodetector to generate charge in response to received light reflected from object 190. The pixel cells are used as storage nodes, to store the charge generated by the photodetector. The photodetector used in photosensor array 120 may be configured for use with various wavelengths or frequencies of light, and in at least one embodiment photosensor array 120 is constructed to provide optimum response using the same wavelength of light as that emitted by LED 140. While various embodiments discussed herein employ a photosensor array 120 that includes only a single photosensor cell, photosensor array 120 may include a two-dimensional array of photosensor cells that can be used to construct a three dimensional (3-D) image of an object from received light.

In at least one embodiment LED 140 is an infrared LED, producing a wavelength of light of approximately 800 nanometers. In other embodiments however, LED 140 may be a blue light LED, a white light LED, or an LED that produces any other suitable wavelengths of light. In addition LED 140 need not be a light emitting diode, but may instead be another type of light source, such as a fluorescent light bulb, an incandescent light bulb, a coherent light source, or any other suitable illumination device or substance.

In another embodiment, clock generator 110 and LED 140 may be a combination of any light source with a mechanical chopper or shutter that periodically blocks the light, with the combination also providing a means of detecting the periods when the chopper or shutter is transmitting or blocking the light from the light source. In that case, the clock signals provided to photosensor array 120 may be synchronized to the chopper/shutter period.

Processor 130 may be any suitable type information handling system, such as a general purpose computer. For example, processor 130 may be a desktop, laptop, mainframe or other computer. Alternatively processor 130 may be a dedicated processing device such as a specially designed processing chip like those found in many automotive applications, hand held communication devices, and the like. In one embodiment, processor 130 is physically separate from photosensor array 120 and receives signals from photosensor array 120 indicative of the voltage stored in various nodes of photosensor array 120. In other embodiments processor may be an integrated device formed on the same silicon as one or more photosensors of photosensor array 120. In yet other embodiments, portions of processor 130 capable of performing some parts of the processing required to differentiate between the phase of light generated by LED 140 and reflected light received at photosensor array 120 may be included in the same packages as part of photosensor array 120, or as part of another processor, co-processor chip, or the like.

Figure 2:
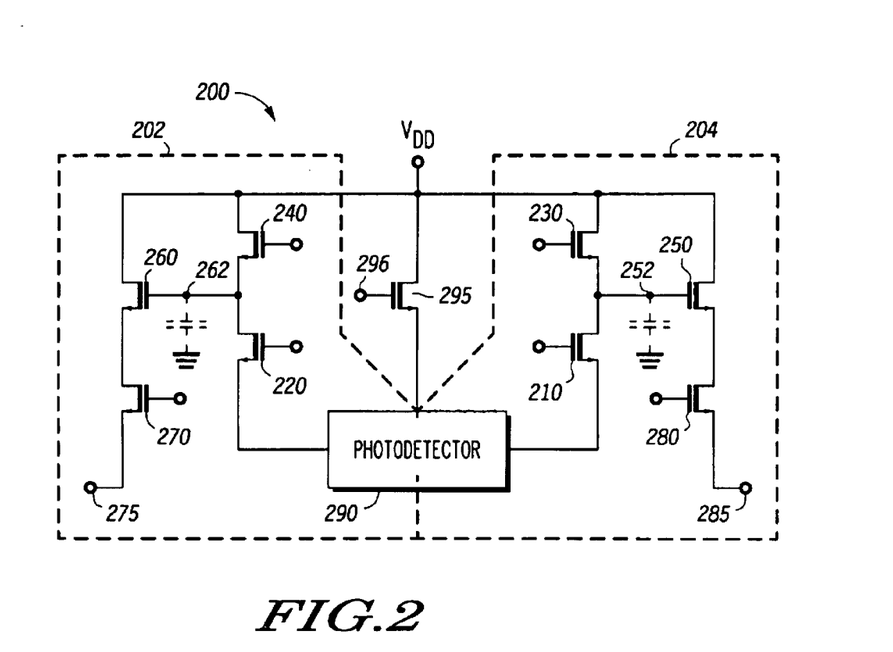
FIG. 2 is a combined schematic and block diagram of a photosensor according to one embodiment of the present disclosure.

Referring next to FIG. 2, a photosensor will be discussed according to an embodiment of the present disclosure, and is designated generally Photosensor 200. Photosensor 200 includes two pixel-cells 202 and 204 to serve as charge storage and readout devices. Pixel cell 202 includes transistors 220, 240, 260 and 270, while pixel cell 204 includes transistors 210, 230, 250 and 280. The two pixel cells 202 and 204 share the common photodetector 290, which may be connected to shunt transistor 295 for blooming protection. In at least one embodiment, the transistors and photodetector that make up photosensor 200 are constructed using CMOS or CMOS compatible technologies.

Specifically, one side of photodetector 290 is coupled to the source of transfer transistor 210. Transfer transistor 210 has a control gate to receive a control signal such as in-phase clock signal $\alpha_1$ or out-of-phase clock signal $\alpha_2$ (FIG. 1). The drain of transfer transistor 210 is connected to the gate of buffer transistor 250 and to the source of reset transistor 230. The drains of reset transistor 230 and buffer transistor 250 are coupled to $V_{DD}$. The source of buffer transistor 250 is connected to the drain of row select transistor 280, and the drain of row select transistor 280 is, in turn, connected to output 285. Floating node 252, at the electrical junction of the gate of buffer transistor 250, the drain of transfer transistor 210, and the source of reset gate 230, is used to store charge generated by photodetector 290, as discussed subsequently in greater detail.

The other side of photodetector 290 is coupled to the source of transfer transistor 220. Transfer transistor 220 has a control gate to receive a control signal such as in-phase clock signal $\alpha_1$ or out-of-phase clock signal $\alpha_2$ (FIG. 1). The drain of transfer transistor 220 is connected to the gate of buffer transistor 260 and to the source of reset transistor 240. The drains of reset transistor 240 and buffer transistor 260 are coupled to $V_{DD}$. The source of buffer transistor 260 is connected to the drain of row select transistor 270, and the drain of row select transistor 270 is, in turn, connected to output 275. Floating node 262, at the electrical junction of the gate of buffer transistor 260, the drain of transfer transistor 220, and the source of reset gate 240, is used to store charge generated by photodetector 290, as discussed subsequently in greater detail.

In addition to the connections already described, photodetector 290 is coupled to the source of shunt transistor 295. Shunt transistor 295 has its drain connected to $V_{DD}$, and has a gate 296 to receive a control signal for providing blooming protection.

The overall operation of photosensor 200 can be understood by considering the operation of pixel cells 202 and 204 individually. Consider for example pixel cell 204. Initially, floating node 252 and photodetector 290 are precharged at the beginning of an acquisition cycle. While this may be accomplished in a number of different ways, in at least one embodiment shunt transistor 295 is turned on to ensure that photodetector 290 is fully depleted for the beginning of an integration cycle. At the same time shunt transistor 295 is turned on, reset transistor 230 is turned on to precharge floating node 252. Instead of turning on shunt transistor 295 to deplete photodetector 290, transfer transistor 210 can be turned on in combination with reset transistor 230 to accomplish a similar result.

Once floating node 252 is precharged and photodetector 290 is fully depleted, shunt transistor 295 and reset transistor 230 may be turned off. In other embodiments however, reset transistor 230 is left on during the integration period to facilitate correlated double sampling. It will be appreciated that when using correlated double sampling, a reference charge is first read from the appropriate storage node, charge from photodetector 290 is transferred to that same storage node, and then the storage node is read out a second time.

After the precharge period, photodetector 290 receives light reflected from an object within a scene being viewed, and responds to the received light by generating charge, which is stored in photodetector 290 during the integration period. During the integration period, shunt transistor 295 may be controlled by supplying a varying control voltage to gate 296. Supplying a varying control voltage to gate 296 of shunt transistor 295, allows the dynamic range of photodetector 290 to be extended to properly detect light being reflected from an object within a high contrast scene. Use of shunt transistor 295 is described in greater detail in U.S. application Ser. No. 10/208,217, entitled "SYSTEM, CIRCUIT AND METHOD PROVIDING A DYNAMIC RANGE PIXEL CELL WITH BLOOMING PROTECTION," filed on Jul. 30, 2002, which application is hereby incorporated by reference.

At the end of the integration phase, when photodetector 290 has stored the charge generated in response to the reflected light, reset transistor 230 and transfer transistor 210 are turned off, if not previously turned off, and the charge stored in floating node 252 during the precharge phase is read out by placing row select transistor 280 in a conductive, or "on", state. Recall that the charge stored in floating node 252 during the precharge phase can serve as a reference voltage for correlated double sampling.

After reading the reference voltage from floating node 252, row select transistor 280 is turned off and transfer transistor 210 is turned on, so that charge stored in photodetector 290 can be transferred to floating node 252. At this point, floating node 252 contains the charge that was generated by photodetector 290 during a first integration phase. After the charge has been transferred to floating node 252 from photodetector 290, row select transistor 280 is turned on again, and the charge stored in floating node 252 is read out a second time. Alternatively, if correlated double sampling is not desired, transfer transistor 210 is turned on and reset transistor 230 is kept off during the integration phase. By leaving transfer transistor 210 on, charge generated by photodetector 290 is continuously transferred to floating node 252. It will be appreciated that correlated double sampling, or other similar sampling techniques, can be implemented by operating the various transistors described above in a different order than that described, without departing from the teachings set forth herein. In subsequent discussion of signal readout, the sensed voltage will be assumed to be measured with respect to the reference (reset) level of the floating node. Pixel cell 202 operates analogously to the pixel cell 204 just described to store charge in floating node 262. Pixel cells 204 and 202 cooperate to store charge in their respective floating nodes during different integration periods. For example, charge generated by photodetector 290 during a first integration period can be stored in floating node 252, while charge generated by photodetector 290 during a second integration period can be stored in floating node 262. By adjusting the integration periods so that a first integration period occurs in-phase with the transmitted light and a second integration period occurs out of phase with the transmitted light, the voltages stored in floating nodes 252 and 262 can be processed to determine a phase difference between transmitted light pulses and light pulses reflected from an object. One skilled in the art can then use this phase difference to determine the distance to an object. A method that can be used to determine the phase difference between transmitted light pulses and reflected light pulses based on the voltages stored in floating nodes 252 and 262 will be discussed in greater detail subsequently.

It will be appreciated that when the control signals for transfer transistors 210 and 220 are 180 degrees out-of-phase, charge generated during a first integration period may be stored exclusively in floating node 252, and charge generated during a second integration period may be stored exclusively in floating node 262. However, in embodiments where the control signals for transistors 210 and 220 are not 180 degrees out-of-phase, some overlap of charge storage between floating nodes 252 and 262 may occur. For example, the control signal for one of the transfer transistors 210 or 220 may be phase shifted from its nominal phase by an amount less than or equal to 90 degrees, so that the control signals are not 180 degrees out-of-phase. Shifting the phase of one of the control signals can be used to minimize problems with aliasing, which occurs when a single voltage relationship between the floating nodes may indicate more than one phase difference. Minimizing aliasing will be discussed further with reference to FIG. 6 and FIG. 7.

The amount of charge stored in floating nodes 252 and 262 can be determined during a readout phase, during which one of row select transistors 280 or 270 is turned on. By turning on row select transistor 280, the output at output port 285 will reflect the voltage stored in floating node 252. Likewise, by activating row select transistor 270 the output at output port 275 will reflect the voltage stored in floating node 262.

Figure 3:
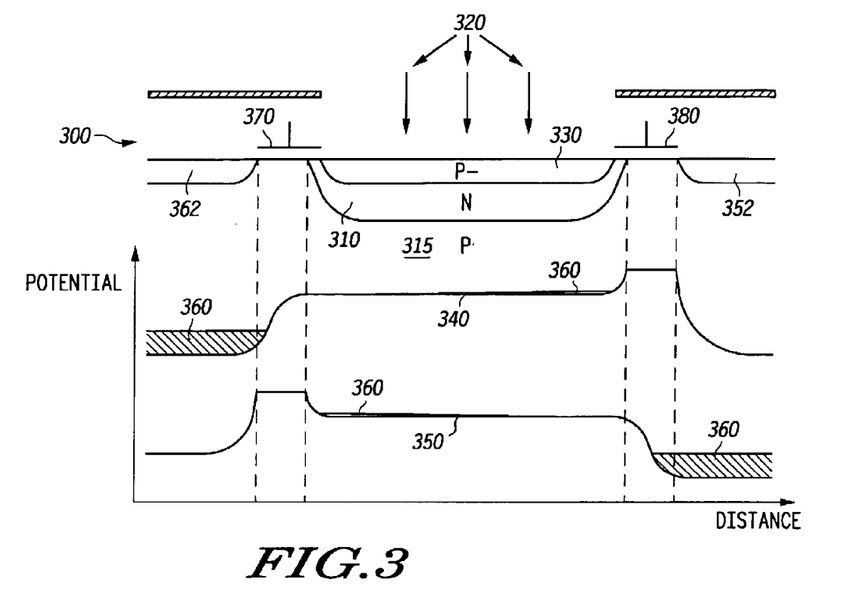
FIG. 3 is a cross sectional view of a pinned photodiode and corresponding well diagrams according to one embodiment of the present disclosure.

Referring next to FIG. 3, a cross section of a photodetector and related well diagrams will be discussed according to one embodiment of the present disclosure. Well diagrams 340 and 350 are illustrative only, and show the voltage potential at various points corresponding to the cross section of photodetector 300. The diagram of FIG. 3 shows photodetector 300 as a pinned photo diode. It will be appreciated, however, that the disclosure presented herein is not limited to the use of pinned photodiodes, and other suitable photodetectors may be employed consistent with the teachings set forth herein. For example, various embodiments of the present disclosure may employ standard photo diodes, photo gates or other suitable photosensitive components compatible with CMOS technologies.

Photodetector 300 includes transfer gates 370 and 380; undoped or lightly doped P-well 330; and heavily doped N-well 310 formed in P-substrate 315. Transfer gates 370 and 380 are one implementation of transfer transistors 210 and 220 (FIG. 2). When received light 320, which has been reflected from an object the distance of which is to be determined, strikes pinned photo diode 300, photodetector 300 generates and stores charge. The charge stored by photodetector 300 is delivered to a storage node, for example storage node 352 or 362, by applying a control voltage to transfer gates 370 and 380.

The well diagrams 340 and 350, shown below photodetector, 300 illustrate the flow of charge 360 based on particular control voltages applied to transfer gates 370 and 380. When transfer gate 370 is on and transfer gate 380 is off, well diagram 340 shows that charge 360 flows from photodetector 300 to storage node 362 while being prevented from flowing into storage node 352. Conversely when transfer gate 380 is turned on and transfer gate 370 is off, charge 360 flows to storage node 352 as shown in well diagram 350. This example shows one way in which a single photodetector 300 can be used to generate charge from incident light that will be stored in one of two different nodes depending on the timing of control signals. It will be appreciated that for some types of photodetectors, for example pinned photodiodes, transfer transistors 210 and 220 (FIG. 2) are not required.

Figure 4:
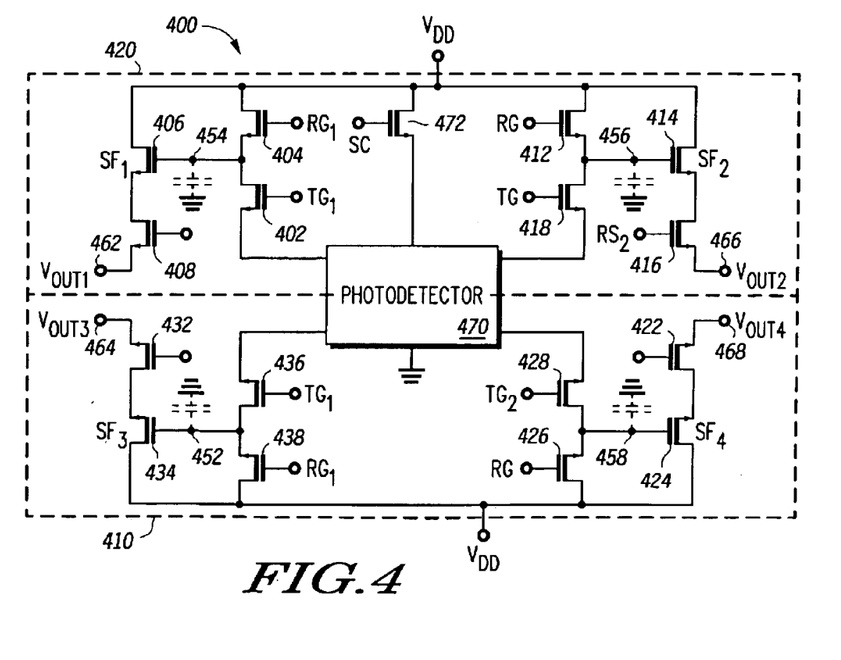
FIG. 4 is a combined schematic and block diagram of a photosensor according to another embodiment of the present disclosure.

Referring next to FIG. 4, an alternate embodiment of a photosensor according to the present disclosure is discussed, and is designated generally Dual Sensor 400. As illustrated by the dotted lines, Dual Sensor 400 includes a first photosensor 420 and a second photosensor 410.

First photosensor 420 includes reset transistor 404 having a control node connected to a reset signal RG1; a current electrode to be coupled to a voltage supply VDD; and a current electrode coupled to floating node 454. First photosensor 420 also includes buffer transistor 406 having a control node connected to floating node 454; a current electrode connected to voltage supply VDD; and a current electrode connected to a current electrode of output transistor 408, which has another current electrode connected to output 462. First photosensor 420 also includes transfer transistor 402 which has a control node to be coupled to a transfer control signal TG1; a current electrode connected to floating node 454; and a current electrode coupled to a charge well of a photodetector 470.

First photosensor 420 further includes reset transistor 412 having a control node connected to a reset signal RG; a current electrode to be coupled to a voltage supply VDD; and a current electrode coupled to floating node 456. First photosensor 420 also includes buffer transistor 414 having a control node connected to floating node 456; a current electrode connected to voltage supply VDD; and a current electrode connected to a current electrode of output transistor 416, which has another current electrode connected to output 466. First photosensor 420 also includes transfer transistor 418 which has a control node to be coupled to a transfer control signal TG; a current electrode connected to floating node 456; and a current electrode coupled to a charge well of a photodetector 470. First photosensor 420 also includes shunt transistor 472 which has a current electrode coupled to VDD, a current electrode coupled to the charge well of photodetector 470, and a control node to be coupled to a shunt control signal, SC.

Second photosensor 410 includes reset transistor 438 having a control node connected to a reset signal RG1; a current electrode to be coupled to a voltage supply VDD; and a current electrode coupled to floating node 452. Second photosensor 410 also includes buffer transistor 434 having a control node connected to floating node 452; a current electrode connected to voltage supply VDD; and a current electrode connected to a current electrode of output transistor 432, which has another current electrode connected to output 464. Second photosensor 410 also includes transfer transistor 436 which has a control node to be coupled to a transfer control signal TG1; a current electrode connected to floating node 452; and a current electrode coupled to a charge well of a photodetector 470.

Second photosensor 410 further includes reset transistor 426 having a control node connected to a reset signal RG; a current electrode to be coupled to a voltage supply VDD; and a current electrode coupled to floating node 458. Second photosensor 410 also includes buffer transistor 424 having a control node connected to floating node 458; a current electrode connected to voltage supply VDD; and a current electrode connected to a current electrode of output transistor 422, which has another current electrode connected to output 468. Second photosensor 410 also includes transfer transistor 428 which has a control node to be coupled to a transfer control signal TG2; a current electrode connected to floating node 458; and a current electrode coupled to a charge well of a photodetector 470.

First photosensor 420 operates identically to second photosensor 410 described in FIG. 2. Second photosensor 410 operates the same as first photosensor 200, except that second photosensor 410 does not include a shunt transistor, since only a single shunt transistor is needed to provide blooming protection for a particular photodetector. It should be noted that a shunt transistor is also optional with respect to first photosensor 420, and is provided primarily to protect against blooming during readout of the pixel cells. First photosensor 420 and second photosensor 410 may operate together to minimize the effects of aliasing as described subsequently with reference to FIG. 6.

Both photosensor 200 (FIG. 2) and photosensor 400 can be used to determine a phase difference between light used to illuminate an object, and light reflected from that object. The primary difference between the operation of dual sensor 400 and photosensor 200 (FIG. 2), is that photosensor 200 (FIG. 2) uses two alternating integration periods to accumulate charge, whereas dual sensor 400 uses four integration periods to accumulate charge.

Figure 5:
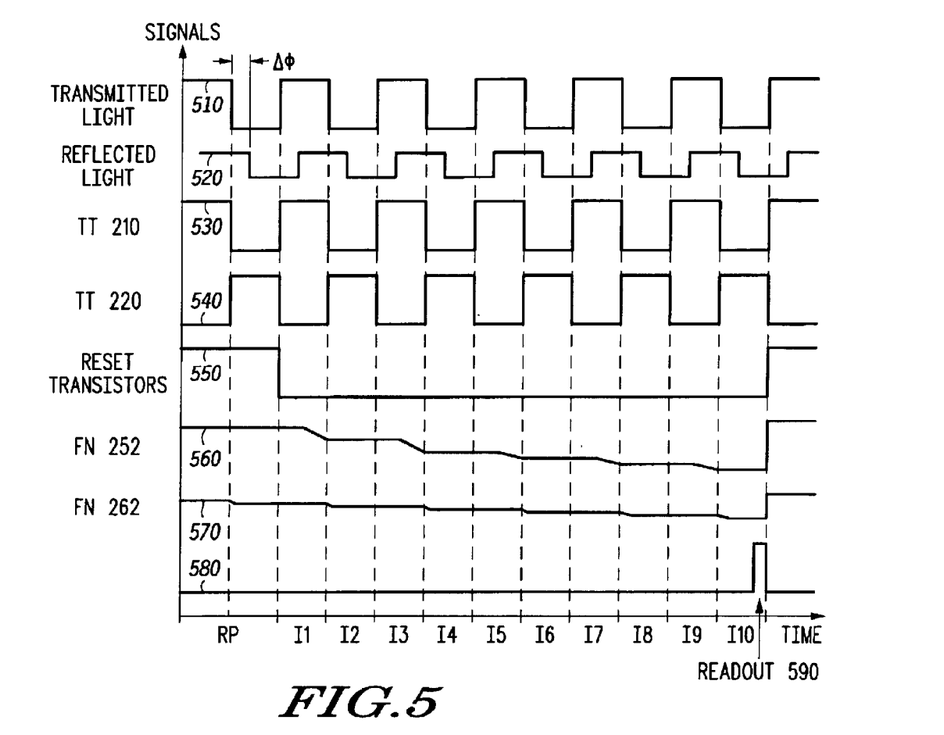
FIG. 5 is a timing diagram illustrating the operation of the photosensor shown in FIG. 2, according to an embodiment of the present disclosure.

Referring next to FIG. 5 with reference to FIG. 2, a timing diagram illustrating the operation of photosensor 200 will be discussed according to an embodiment of the present disclosure. Recall that in determining the distance to an object, pulsed light is transmitted from a light source and is reflected back to a photodetector. The transmitted light pulses are represented by curve 510, and the reflected light pulses are represented by curve 520. The difference between the phase of the transmitted light pulses and the phase of the reflected light pulses is represented by $\Delta \emptyset$.

Transfer transistor 210 is controlled by signal 530 while transfer transistor 220 is controlled by signal 540. Note that signal 530 is in-phase with transmitted-light curve 510, while control signal 540 is 180 degrees out-of-phase with transmitted-light curve 510. Note that in other embodiments, a phase shift can be introduced into curve 530 or 540, such that control signals 530 and 540 are not exactly 180 degrees out-of-phase. The voltages on floating nodes 252 and 262 are represented by curves 560 and 570 respectively.

During a reset period (shown as RP on the x-axis of FIG. 5), signal 550 turns reset transistors 230 and 240 on, thereby precharging floating nodes 252 and 262. At the end of the reset period, signals 530 and 540 turn transfer gates 210 and 220 on and off during alternating integration periods, causing a corresponding flow of charge into floating nodes 252 and 262. When transfer transistor 210 is turned on by signal 530 during the first integration period (illustrated as I1 on the x-axis of FIG. 5), charge generated by photodetector 290 is transferred to floating node 252, thereby making the voltage of floating node 252, represented by curve 560, more negative.

During the second integration period (illustrated as I2 on the x-axis of FIG. 5) the charge in floating node 252 remains the same, but the voltage stored in floating 262, represented by curve 570, decreases because transfer transistor 220 is turned on, thereby allowing charge from photodetector 290 to be transferred to floating node 262. This alternating activation of transfer transistors 210 and 220 continues for a desired number of clock cycles. Note that while ten clock cycles are illustrated, more or fewer clock cycles may be used as desired. Also note that the amount of charge generated by photodetector 290 during the periods when transfer transistor 210 is on, is greater than the amount of charge generated by photodetector 290 during the time periods when transfer transistor 220 is on, because a greater portion of each light pulse strikes photodetector 290 when transfer transistor 210 is turned on in phase with the transmitted light pulses 510, than when transfer transistor 210 is on out of phase.

At the end of the last integration period, integration phase 10 in the illustrated embodiment, row select transistors 270 and 280 are placed in a conductive state so that the two pixel cells making up photosensor 200 may be read out during readout period 590. After readout period 590 the cycle begins again with activation of reset transistors 230 and 240.

The two different voltages stored in floating nodes 252 and 262 (FIG. 2) can be converted to a phase difference according to the following formula:

$$\Delta\emptyset = \pi/2(1-(V_{FD1}-V_{FD2})/(V_{FD1}+V_{FD2})), \text{ [for } 0<\Delta\emptyset<\pi]$$

$$\Delta\emptyset = \pi/2(3+(V_{FD1}-V_{FD2})/(V_{FD1}+V_{FD2})), \text{ [for } \pi<\Delta\emptyset<2\pi]$$

where $\Delta\emptyset$ is the phase difference in radians between the pulsed illumination source and the reflected light pulse;

$V_{FD1}$ is the magnitude of the voltage (relative to the reset state) in the "in-phase" storage node; and $V_{FD2}$ is the magnitude of the voltage (relative to the reset state) in the other storage node.

The following formula may also be used:

$$\Delta\emptyset = \pi/2(1-(V_{OUT1}-V_{OUT2})/(V_{OUT1}+V_{OUT2})), \text{ [for } 0<\Delta\emptyset<\pi]$$

$$\Delta\emptyset = \pi/2(3+(V_{OUT1}-V_{OUT2})/(V_{OUT1}+V_{OUT2})), \text{ [for } \pi<\Delta\emptyset<2\pi]$$

where $\Delta\emptyset$ is the phase difference in radians between the pulsed illumination source and the reflected light pulse;

$V_{out1}$ is the magnitude of the voltage (relative to the reset level) at the "in-phase" output of photosensor 200, where the output is a function of the voltage on the corresponding storage node; and $V_{out2}$ is the magnitude of the voltage (relative to the reset level) at the other output of photosensor 200, where the output is a function of the voltage on the corresponding storage node.

Alternatively, if a dual sensor, such as dual sensor 400 (FIG. 4) is used, the output of dual sensor 400 can be converted to a phase difference according to the following formula:

$$\Delta\emptyset = \text{Arctan }[(V_{OUT2}-V_{OUT4})/(V_{OUT1}-V_{OUT3})],$$

where $\Delta\emptyset$ is the phase difference in radians between the pulsed illumination source and the reflected light pulse;

$V_{out1}$ is the voltage at a first output of photosensor 200, where the output is a function of the voltage on the corresponding storage node;

$V_{out2}$ is the voltage at a second output of photosensor 200, where the output is a function of the voltage on the corresponding storage node;

$V_{out3}$ is the voltage at a third output of photosensor 200, where the output is a function of the voltage on the corresponding storage node; and $V_{out4}$ is the voltage at the fourth output of photosensor 200, where the output is a function of the voltage on the corresponding storage node.

This phase difference can then be used to determine the distance to the object according to the formula: D=$\Delta\emptyset$ c T÷4$\pi$; where D=distance, $\Delta\emptyset$=the difference in-phase between the light used to illuminate the object and the light reflected from the object, c=the speed of light, and T is the period of one clock cycle for the drive of the LED (as shown in FIG. 5).

Figure 6:
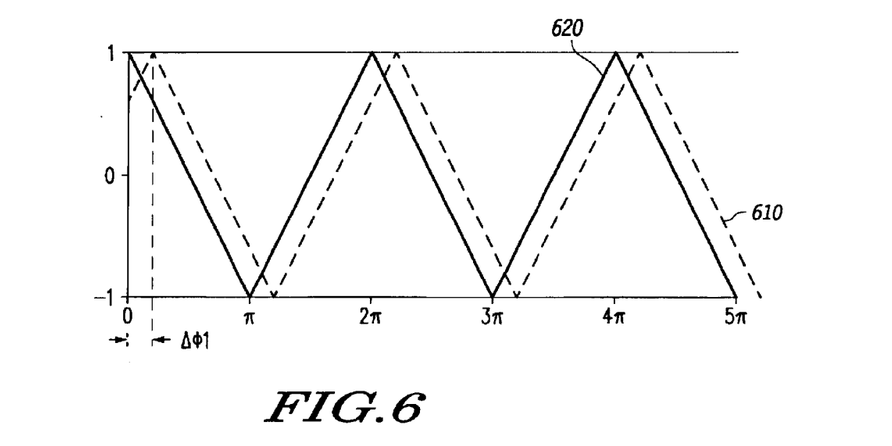
FIG. 6 is a graph illustrating how aliasing can be avoided by shifting the timing of a transfer gate signal according to an embodiment of the present disclosure.

Referring next to FIG. 6 with reference to FIG. 2 a method of preventing aliasing will be discussed according to an embodiment of the present disclosure. In the context of this disclosure, aliasing occurs when a single set of voltage values for floating nodes 252 and 262 (FIG. 2) can yield more than one phase-shift value. Consider, for example, curve 620. The x-axis of the graph illustrated in FIG. 6 is the phase difference between the transmitted light pulses used to illuminate an object and the reflected light pulses, and the y-axis is normalized voltage. For purposes of this example, assume that the normalized voltage difference between floating node 252 and floating node 262 is zero. Upon consideration of FIG. 6, it becomes apparent that curve 620 has a value of zero at $\pi/2$, $3\pi/2$, $2\pi/2$, etc. These multiple possible "aliases" make it impossible to determine the actual phase shift without more information.

The extra information needed to eliminate aliasing between 0 and $2\pi$ is provided by Curve 610. While Curve 620 plots the phase difference between transmitted and reflected light pulses for the case where the transfer transistor control signals are 180 degrees out of phase, dotted curve 610 plots the phase difference between transmitted and reflected light pulses for the case where the control signals are not exactly 180 degrees out of phase. For Curve 610, one of the control signals is in phase with transmitted light pulses, and the other control signal is shifted by an amount represented by $\Delta\emptyset1$, where $\Delta\emptyset1$ is between 0 and $\pi$, inclusive. By employing both curves 610 and 620, problems with aliasing can be eliminated between 0 and $2\pi$.

In use then, if charge is stored during two integration phases in floating nodes 252 and 262 using control signals that are 180 degrees out of phase, then curve 620 can be generated. If during a subsequent two integration phases charge is stored in floating nodes 252 and 262 using control signals that are not exactly 180 degrees out of phase, then curve 610 can be generated. The two curves can then be used to uniquely determine a phase shift between transmitted light pulses and reflected light pulses.

For example, if the normalized voltage difference between floating nodes 252 and 262 during the first two integration phases is zero, then using curve 620, an angle of either $\pi/2$ or $3\pi/2$ might be indicated. If during two subsequent integration phases, the normalized voltage difference between floating nodes 252 and 262 is 0.5, then curve 610 can be used in conjunction with curve 620 to determine that the true phase difference is $\pi/2$. If the normalized voltage difference between floating nodes 252 and 262 were −0.5, then the true phase difference would be $3\pi/2$. In this way, the differences between curve 620 and 610 can be used to uniquely distinguish phase differences, in the range of 0 to $2\pi$, without being affected by aliasing. It will be appreciated that additional curves could be generated using the same techniques, and the range of anti-aliasing could thereby be extended beyond $2\pi$ without departing from the spirit and scope of the teachings set forth herein.

Figure 7:
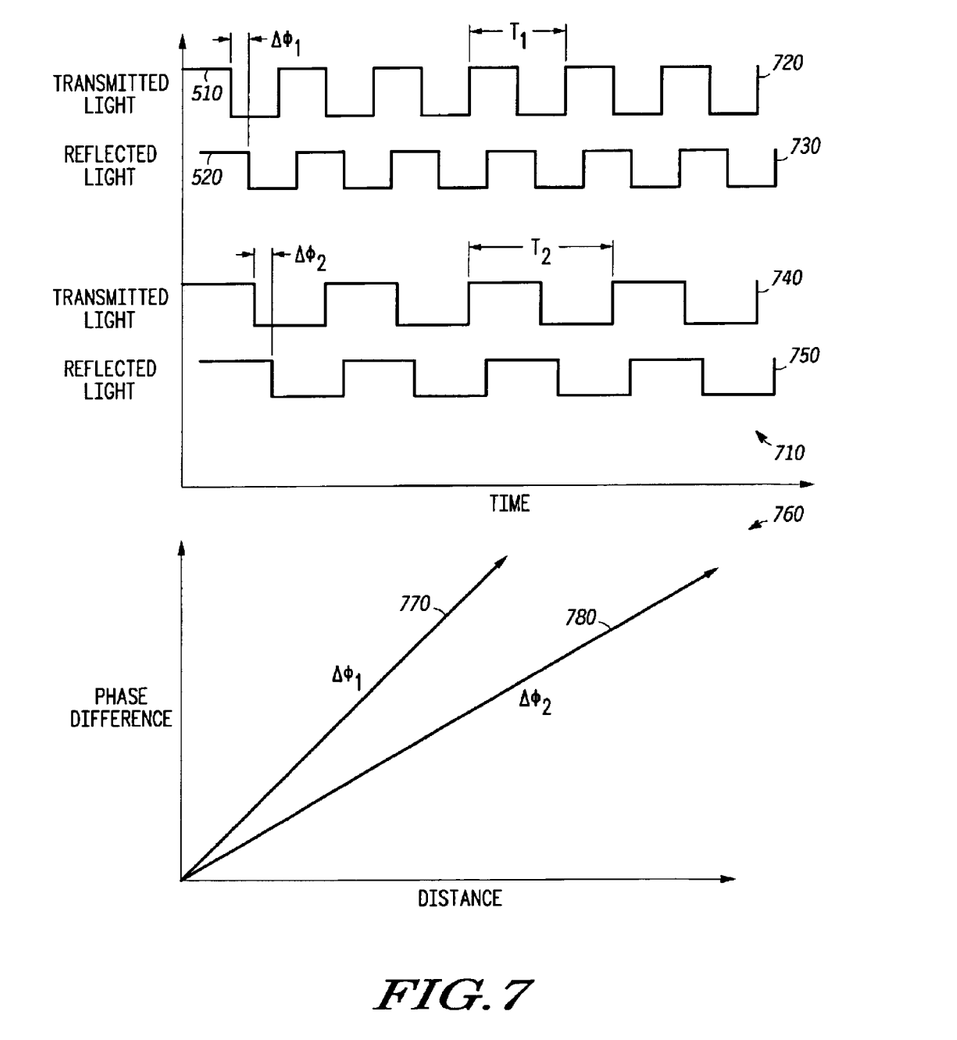
FIG. 7 is a series of timing diagrams and an associated phase diagram illustrating how aliasing can be reduced by altering the frequency of a transfer gate signal according to an embodiment of the present disclosure.

Referring next to FIG. 7 with reference to FIG. 2 and FIG. 5, a second method of preventing aliasing will be discussed according to an embodiment of the present disclosure. In the context of this disclosure, aliasing occurs when a single set of voltage values for floating nodes 252 and 262 (FIG. 2) can yield more than one phase-shift value. Consider, for example, graphs 710 and 760 in FIG. 7. The x-axis of the graph 710 illustrated in FIG. 7 is time, while the vertical axis shows the light signal for transmitted and reflected light pulses.

The light signal is shown for two different pulse frequencies. In the upper half of graph 710, the transmitted light signal 720 and reflected light signal 730 are shown for a modulating signal with a period $T_1$, and a resulting phase shift $\Delta\Phi_1$, a first portion of a phase detection cycle. In the lower half of graph 710, the transmitted light signal 740 and reflected light signal 750 are shown for a modulating signal with a period $T_2$, and a resulting phase shift $\Delta\Phi_2$, during a second portion of the phase detection cycle in the illustrated embodiment, the period $T_2$ of transmitted light signal 740 is longer than the period $T_1$ of transmitted light signal 720.

The detected phase shift as a function of distance is smaller for the longer-period modulating signal, as illustrated in graph 760. The detected phase shift $\Delta\Phi_1$ for the transmitted light signal 720 and reflected light signal 730 is shown as a function of distance by curve 770. The detected phase shift $\Delta\Phi_2$ for the transmitted light signal 740 and reflected light signal 750 is shown as a function of distance by curve 780. The phase shift $\Delta\Phi_1$ increases more rapidly with distance to the reflecting object than does phase shift $\Delta\Phi_2$.

This change of the phase shift by varying the light modulating frequency can be used to eliminate aliasing of the detected phase shift signal. The frequency of the light modulating system can be varied during different portions of the phase detection cycle, for example, by using different modulation frequencies during sequential frames, such that different phase shifts can be detected for the different frequencies. The change of phase shift with frequency will allow detection of aliasing, and determination of the correct phase shift. It will be appreciated that the embodiments discussed in relation to FIG. 7 can be extended to include additional different frequencies applied during different portions of a phase detection cycle.

In summary then by using a photodetector constructed with CMOS technologies in combination with CMOS pixel cells a photosensor can be constructed for use in determining the distance to an object. A clock signal can be employed to one transfer transistor of a first pixel cell such that charge generated during a first integration period is stored in the first pixel cell and a second clock signal 180 degrees out-of-phase with a reference signal can be applied to a transfer transistor of a second pixel cell such that charge generated by the photodetector during a second integration phase is stored in the second pixel cell. The charge stored in the floating nodes of the pixel cells can be read out and used to determine a phase difference between light illuminating an object and light reflected from the object. This phase difference can in turn be used to determine the distance to that object. A shunt transistor may or may not be provided to protect the photodetector from blooming during both integration and readout.

In the preceding detailed description of the figures, reference has been made to the accompanying drawings, which form a part thereof, and in which is shown by way of illustration specific embodiments in which the disclosure may be practiced. These embodiments are described in sufficient detail to enable those skilled in the art to practice the disclosure, and it is to be understood that other embodiments may be utilized and that logical, mechanical, chemical, and electrical changes may be made without departing from the spirit or scope of the disclosure. For example while the above discussion focuses primarily on the use of n-channel CMOS transistors, p-channel CMOS transistors can be used with appropriate modifications in reference voltages, well types and polarities, and interpretation of output signals, MOS transistors may be used, as well as other suitable transistor types. In addition although specific photo sensor types have been discussed in particular embodiments above various photosensors such as pinned photo diodes, photo diodes, photo gates and the like may all be employed under proper circumstances in implementing the present disclosure. It has also been discussed, in particular examples above that the voltage of the shunt transistor may be varied with time such that excess charge generated by a photo sensor is shunted to avoid blooming of the photosensor and/or to provide an expanded dynamic range of a pixel cell.

Furthermore, many other varied embodiments that incorporate the teachings of the disclosure may be easily constructed by those skilled in the art. For example the embodiments discussed above show outputs employing row and column select access configurations. Other suitable access configurations may be used to read out charge stored by a pixel cell in a photosensor, without departing from the spirit and scope of the present disclosure. To avoid detail not necessary to enable those skilled in the art to practice the invention, the description may omit certain information known to those skilled in the art. Accordingly, the present disclosure is not intended to be limited to the specific form set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. A circuit comprising:
  a CMOS compatible photodetector to produce charge in response to incident light;
  a plurality of storage nodes to store charge generated by said photodetector;
  a plurality of control transistors to route charge from said photodetector to said plurality of storage nodes; and
  a plurality of amplifiers coupled to said storage nodes, said plurality of amplifiers to provide an output related to an amount of charge stored in said storage nodes; and
  a plurality of reset transistors coupled to said storage node, said plurality of reset transistors to precharge said storage nodes.

2. A circuit comprising:
  a CMOS compatible photodetector to produce charge in response to incident light;
  a plurality of storage nodes to store charge generated by said photodetector;
  a plurality of control transistors to route charge from said photodetector to said plurality of storage nodes, wherein said plurality of control transistors include a first transfer transistor to route charge in response to a clock signal in-phase with a reference signal and a second transfer transistor to route charge in response to a clock signal out-of-phase with the reference signal; and
  a plurality of amplifiers coupled to said storage nodes, said plurality of amplifiers to provide an output related to an amount of charge stored in said storage nodes.

3. The circuit as in claim 2, further including a shunt transistor coupled to said photodetector, said shunt transistor to provide blooming protection.

4. The circuit as in claim 2, further including a plurality of output transistors coupled to said plurality of amplifiers, said plurality of output transistors to switch the output of said plurality of amplifiers in response to a control signal.

5. The circuit as in claim 2, wherein said photodetector is a photodiode.

6. The circuit as in claim 5, wherein said photodiode is a pinned photodiode.

7. The circuit as in claim 2, wherein said photodetector is a photogate.

8. The circuit as in claim 2, wherein said control transistors are formed using a CMOS process.

9. A circuit comprising:
a CMOS compatible photodetector to produce charge in response to incident light;
a plurality of storage nodes to store charge generated by said photodetector;
a plurality of control transistors to route charge from said photodetector to said plurality of storage nodes;
a first reset transistor, said first reset transistor including:
a control node to be coupled to a first control signal;
a second current electrode to be coupled to a voltage supply; and
a first current electrode coupled to a first floating node;
a first buffer transistor, said first buffer transistor including:
a control node coupled to said first floating node;
a second current electrode to be coupled to said voltage supply; and
a first current electrode coupled to a current electrode of an output transistor;
said plurality of control transistors including a first transfer transistor, said first transfer transistor including:
a control node to be coupled to a second control signal;
a second current electrode coupled to said first floating node; and
a first current electrode coupled to a charge well of the photodetector;
a second reset transistor, said second reset transistor including:
a control node to be coupled to a third control signal;
a second current electrode to be coupled to a voltage supply; and
a first current electrode coupled to a second floating node;
a second buffer transistor, said second buffer transistor including:
a control node coupled to said second floating node;
a second current electrode to be coupled to said voltage supply; and
a first current electrode coupled to a current electrode of a second output transistor;
said plurality of control transistors further including a second transfer transistor, said second transfer transistor including:
a control node to be coupled to a fourth control signal;
a second current electrode coupled to said second floating node; and
a first current electrode coupled to said charge well of said photodetector;
wherein said photodetector includes the charge well coupled to said first current electrode of said first transfer transistor and further coupled to said first current electrode of said second transfer transistor.

10. The circuit as in claim 9, further including:
a third reset transistor, said third reset transistor including:
a control node to be coupled to a fifth control signal;
a second current electrode to be coupled to said voltage supply; and
a first current electrode coupled to a third floating node;
a third buffer transistor, said third buffer transistor including:
a control node coupled to said third floating node;
a second current electrode to be coupled to said voltage supply; and
a first current electrode coupled to a current electrode of a third output transistor;

a third transfer transistor, said third transfer transistor including:
a control node to be coupled to a sixth control signal;
a second current electrode coupled to said third floating node; and
a first current electrode coupled to a charge well of a photodetector;
a fourth reset transistor, said fourth reset transistor including:
a control node to be coupled to a third control signal;
a second current electrode to be coupled to a voltage supply; and
a first current electrode coupled to a second floating node;
a fourth buffer transistor, said fourth buffer transistor including:
a control node coupled to said second floating node;
a second current electrode to be coupled to said voltage supply; and
a first current electrode coupled to a current electrode of a second output transistor;
a fourth transfer transistor, said fourth transfer transistor including:
a control node to be coupled to a fourth control signal;
a second current electrode coupled to said second floating node; and
a first current electrode coupled to an input of said photodetector;
the photodetector, said photodetector including the charge well coupled to said first current electrode of said third transfer transistor and further coupled to said first current electrode of said fourth transfer transistor.

11. The circuit of claim 10, wherein the first floating node is a first storage node of the plurality of storage nodes, the second floating node is a second storage node of the plurality of storage nodes, the third floating node is a third storage node of the plurality of storage nodes, and the fourth floating node is a fourth storage node of the plurality of storage nodes.

12. The circuit of claim 9, wherein the first floating node is a first storage node of the plurality of storage nodes and the second floating node is a second storage node of the plurality of storage nodes.

13. A distance-measuring device comprising:
a light source;
a clock generator coupled to said light source; and
a photosensor, said photosensor including:
a CMOS compatible photodetector to produce charge in response to incident light;
a plurality of storage nodes to store charge generated by said photodetector;
a plurality of output transistors to couple said storage nodes to an output of said photodetector, said plurality of output transistors includes a plurality of amplifiers coupled to said storage nodes, said plurality of amplifiers to provide an output related to an amount of charge stored in said storage nodes;
a plurality of control transistors to selectively couple said photodetector to said storage nodes; and
a plurality of reset transistors coupled to said storage nodes, said plurality of reset transistors to precharge said storage nodes.

14. A distance-measuring device comprising:
a light source;
a clock generator coupled to said light source; and
a photosensor, said photosensor including:
- a CMOS compatible photodetector to produce charge in response to incident light;
- a plurality of storage nodes to store charge generated by said photodetector;
- a plurality of output transistors to couple said storage nodes to an output of said photodetector, said plurality of output transistors includes a plurality of amplifiers coupled to said storage nodes, said plurality of amplifiers to provide an output related to an amount of charge stored in said storage nodes;
- a plurality of control transistors to selectively couple said photodetector to said storage nodes, wherein said plurality of control transistors include a first transfer transistor to route charge in response to a clock signal in-phase with a reference signal and a second transfer transistor to route charge in response to a clock signal out-of-phase with the reference signal.

15. The distance-measuring device as in claim 14, wherein said photosensor further includes a shunt transistor coupled to said photodetector, said shunt transistor to provide blooming protection.

16. The distance-measuring device as in claim 14, wherein said output is indicative of a distance from said photosensor to an object.

17. The distance-measuring device as in claim 14, wherein said plurality of output transistors further includes transistors coupled to said plurality of amplifiers, said plurality of output transistors to switch the output of said plurality of amplifiers in response to a control signal.

18. The distance-measuring device as in claim 14, wherein said photodetector is a photodiode.

19. The distance-measuring device as in claim 18, wherein said photodiode is a pinned photodiode.

20. The distance-measuring device as in claim 14, wherein said photodetector is a photogate.

21. The distance-measuring device as in claim 14, wherein said control transistors are formed using a CMOS process.

22. The distance-measuring device as in claim 14, further including an array of photosensors.

23. A method comprising:
generating a reference clock;
pulsing a light source in synchronization with the reference clock;
illuminating a scene with the pulsing light source;
receiving light reflected from an object within the scene using a CMOS photosensor over a predetermined period of time; and
wherein receiving includes:
- applying a clock in-phase with the reference clock to a first gate during a first portion of the predetermined period, such that charge generated by a photodetector is stored in a first storage node;
- applying a clock out-of-phase with the reference clock to a second gate during a second portion of the predetermined period, such that charge generated by the photodetector is stored in a second storage node; and
- determining a distance to the object based on an amount of charge stored in the first storage node and an amount of charge stored in the second storage node.

24. The method as in claim 23, wherein the out-of-phase clock is 180 degrees out-of-phase with the reference signal.

25. The method as in claim 23, wherein the out-of-phase clock is between 90 degrees out-of-phase and 180 degrees out-of-phase, inclusive.

26. A method comprising:
generating a reference clock having a first frequency during a first portion of a phase detection cycle and having a second frequency, different from the first frequency, during a second portion of the phase detection cycle;
pulsing a light source in synchronization with the reference clock during the first portion of the phase detection cycle;
illuminating a scene with the pulsing light source;
receiving light reflected from an object within the scene using a CMOS photosensor over a first predetermined period of time, wherein receiving includes:
- applying a clock in-phase with the reference clock to a first gate during a first portion of the first predetermined period, such that charge generated by a photodetector is stored in a first storage node;
- applying a clock out-of-phase with the reference clock to a second gate during a second portion of the first predetermined period, such that charge generated by the photodetector is stored in a second storage node;
- determining a first phase difference based on an amount of charge stored in the first storage node and an amount of charge stored in the second storage node;

pulsing the light source in synchronization with the reference clock during the second portion of the phase detection cycle;
illuminating the scene with the pulsing light source;
receiving light reflected from the object within the scene using the CMOS photosensor over a second predetermined period of time, wherein receiving includes:
- applying a clock in-phase with the reference clock to the first gate during a first portion of the second predetermined period, wherein charge generated by the CMOS photosensor is stored the first storage node;
- applying a clock out-of-phase with the reference clock to a second gate during a second portion of the second predetermined period, wherein charge generated by the photodetector is stored in the second storage node;
- determining a second phase difference based on an amount of charge stored in the first storage node and an amount of charge stored in the second storage node; and
- determining a distance to the object based on the first phase difference and the second phase difference.

27. The method as in claim 26, further includes determining a distance based on additional phase differences and addition clock frequencies.

* * * * *

UNITED STATES PATENT AND TRADEMARK OFFICE
CERTIFICATE OF CORRECTION

PATENT NO. : 6,906,302 B2
DATED : June 14, 2005
INVENTOR(S) : Clifford I. Drowley It is certified that error appears in the above-identified patent and that said Letters Patent is hereby corrected as shown below:

Column 12,
Line 35, change "node" to -- nodes --.

Signed and Sealed this

Thirtieth Day of August, 2005

JON W. DUDAS
*Director of the United States Patent and Trademark Office*